United States Patent
Chan et al.

(10) Patent No.: US 8,810,319 B1
(45) Date of Patent: Aug. 19, 2014

(54) DUAL-STAGE CONTINUOUS-TIME LINEAR EQUALIZER

(75) Inventors: Allen Chan, San Jose, CA (US); Nicholas Sutardja, Berkeley, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/492,550

(22) Filed: Jun. 8, 2012

(51) Int. Cl.
  *H03F 3/191* (2006.01)
(52) U.S. Cl.
  USPC .......................................... 330/304; 330/253
(58) Field of Classification Search
  USPC .......... 330/253, 260, 304, 254; 375/229, 232, 375/233
  See application file for complete search history.

(56) References Cited

U.S. PATENT DOCUMENTS

| | | | |
|---|---|---|---|
| 7,916,780 B2 * | 3/2011 | Lee | 375/232 |
| 8,537,886 B1 * | 9/2013 | Su et al. | 375/233 |
| 2009/0316770 A1 | 12/2009 | Hidaka | |
| 2009/0316771 A1 | 12/2009 | Hidaka | |
| 2009/0316772 A1 | 12/2009 | Hidaka | |
| 2012/0128055 A1 | 5/2012 | Jiang | |
| 2012/0188031 A1 * | 7/2012 | Wu et al. | 333/28 R |
| 2012/0201289 A1 * | 8/2012 | Abdalla et al. | 375/233 |
| 2013/0215954 A1 * | 8/2013 | Beukema et al. | 375/233 |

OTHER PUBLICATIONS

Altera Application Note—Understanding the Pre-Emphasis and Linear Equalization Features in Stratix IV GX Devices, Nov. 2010, pp. 16, Altera Corporation.

* cited by examiner

*Primary Examiner* — Khanh V Nguyen
(74) *Attorney, Agent, or Firm* — Okamoto & Benedicto LLP

(57) ABSTRACT

One embodiment relates an equalizer which includes a first amplifier stage and a second amplifier stage. The first amplifier stage is configured to apply a first gain at a characteristic frequency while attenuating frequencies in a low frequency range. The second amplifier stage is configured to apply a second gain at the frequencies in the low frequency range. The first amplifier stage may be configured before the second amplifier stage, or vice versa. Another embodiment relates to a method of linear equalization. Another embodiment relates to an amplifier which may be used for linear equalization. Other embodiments, aspects, and features are also disclosed.

17 Claims, 11 Drawing Sheets

DUAL-STAGE CONTINUOUS-TIME LINEAR EQUALIZER

BACKGROUND

1. Technical Field

The present invention relates generally to data communication circuits, including serial interface circuits.

2. Description of the Background Art

Due to the ever increasing demand for higher data rates, there has been an increasing interest in equalization schemes that are able to recover signals which have been degraded by physical losses in a channel. To compensate for severe channel losses, some receiver equalizers use non-linear equalization schemes, such as Decision Feedback Equalization (DFE), for example. However, DFE is unable to equalize for pre-cursor inter-symbol Interference, and high-loss channels most often require multi-tap DFE schemes which put a burden on timing and on power.

SUMMARY

One embodiment relates to an equalizer which includes a first amplifier stage and a second amplifier stage. The first amplifier stage is configured to apply a first gain at a characteristic frequency while attenuating frequencies in a low frequency range below the characteristic frequency. The second amplifier stage is configured to apply a second gain at frequencies in the low frequency range. The first amplifier stage may be configured before the second amplifier stage, or vice versa.

Another embodiment relates to a method of linear equalization. An analog signal is received. A first gain is applied to the analog signal at a characteristic frequency while attenuating the analog signal at frequencies in a low frequency range below the characteristic frequency. In addition, a second gain is applied to the analog signal at the frequencies in the low frequency range. The first gain may be applied before the second gain, or vice versa.

Another embodiment relates to an amplifier. The amplifier includes first and second transistor pairs. In both transistor pairs, the drain of one transistor is connected to the gate of the other transistor in the pair.

Other embodiments, aspects, and features are also disclosed.

DETAILED DESCRIPTION

One conventional continuous-time linear equalizer (CTLE) design uses a capacitive-source-degenerated (CSD) differential wideband amplifier. This type of CTLE may be effective for lower-frequency operation. However, it can only accommodate a limited bandwidth because the bandwidth is heavily dependent on the load capacitance.

Another conventional CTLE design uses a CSD differential wideband amplifier with inductive shunt peaking. This structure utilizes an inductor between the voltage source and the load resistor. This results in a peak in the response which may be used to compensate for the capacitive null and so helps to extend the bandwidth. However, despite the use of the shunt inductors, this structure is still substantially dependent on the load capacitance.

Applicants have determined that both the above-discussed conventional CTLE designs are substantially limited when trying to support a high data rate of 50 gigabits per second (Gbps) at a frequency of up to 25 gigahertz (GHz). In particular, the above-discussed conventional CTLE designs have a DC gain that is very close to unity which is detrimental in that it effectively limits the bandwidth to lower frequencies.

The present disclosure provides apparatus and methods for continuous-time linear equalization which effectively address the bandwidth limitation of the conventional designs. The apparatus and methods allow for continuous-time linear equalization at frequencies of 25 GHz or more to support data rates of 50 Gbps or more.

Figure 1:
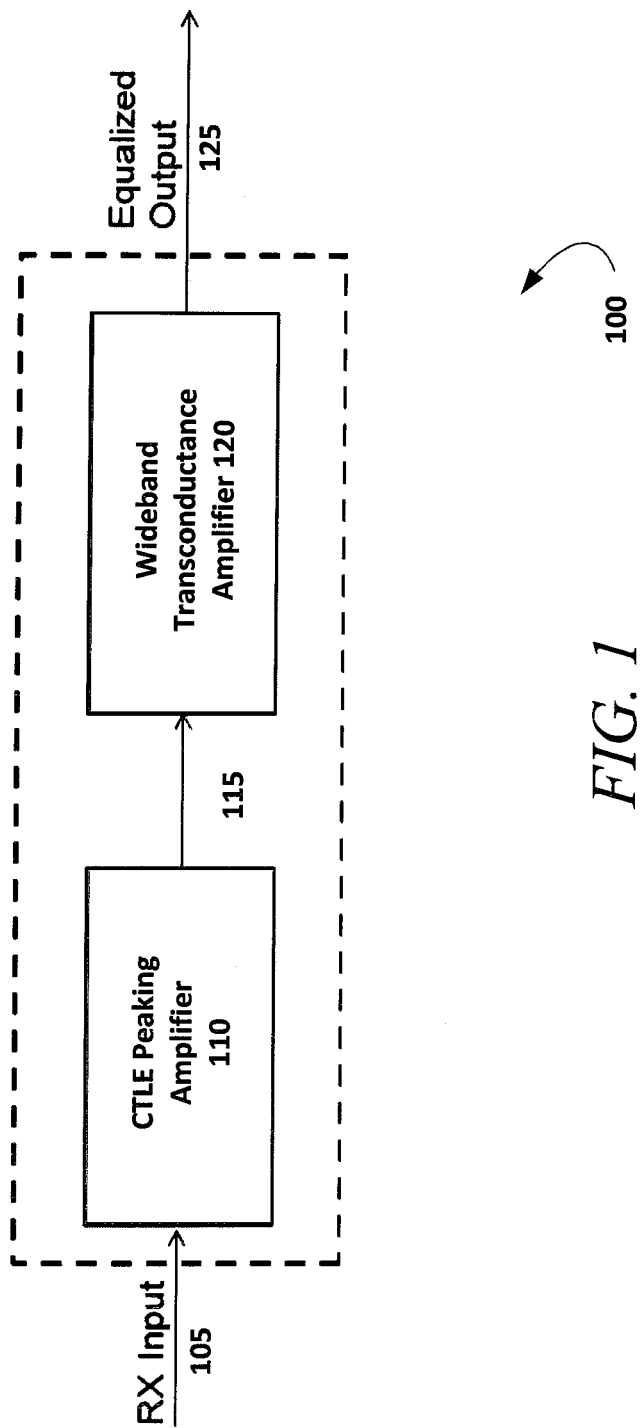
FIG. 1 is a high-level diagram of a dual-stage continuous-time linear equalizer in accordance with an embodiment of the invention.

FIG. 1 is a high-level diagram of a dual-stage CTLE 100 in accordance with an embodiment of the invention. As shown, a receiver (RX) input 105 is received by a first stage 110 which may be implemented as a CTLE peaking amplifier. The output 115 of the first stage 110 is input into a second stage 120 which may be implemented a wideband transconductance amplifier. The output of the second stage 120 is the equalized output 125.

Figure 2:
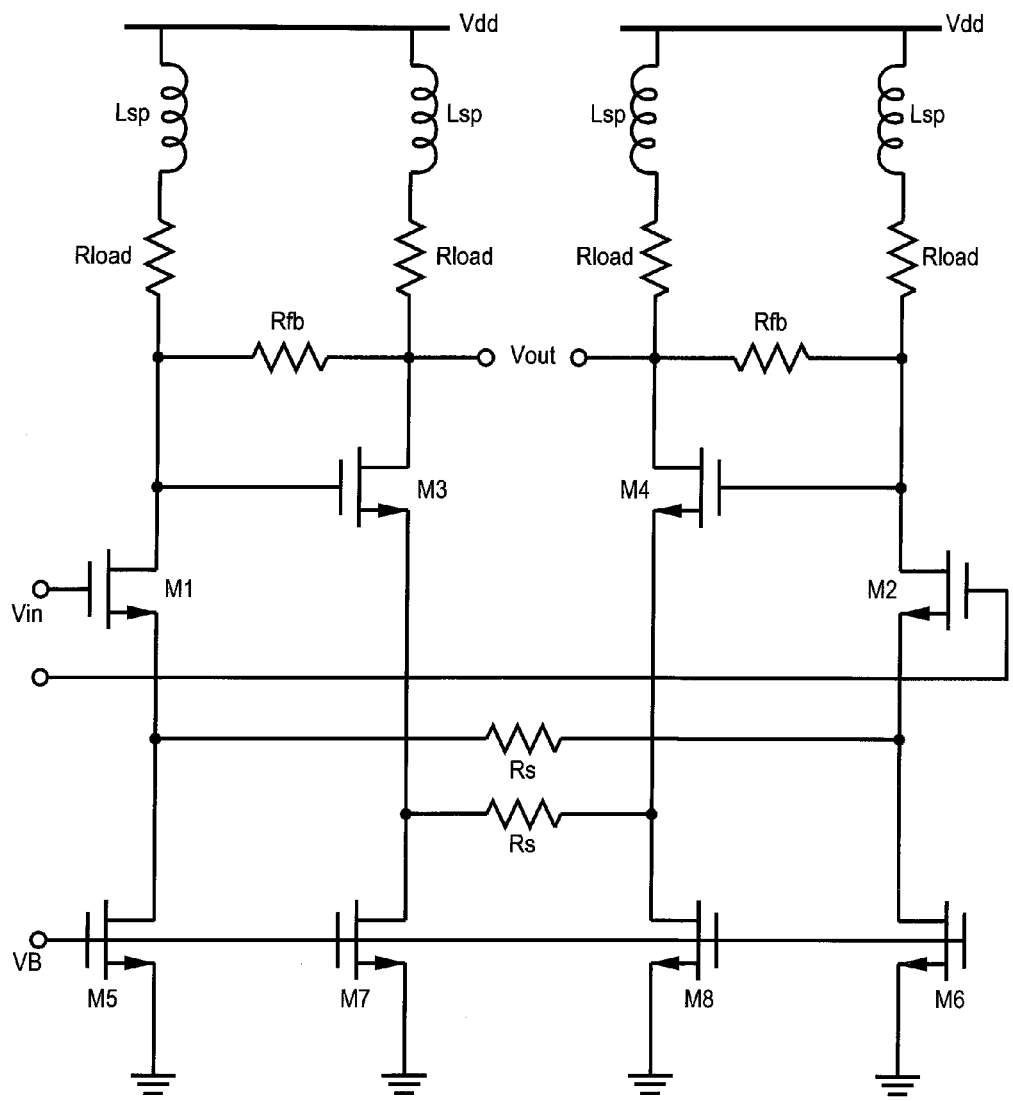
FIG. 2 is an exemplary circuit diagram of a CTLE peaking amplifier which may be used as the first stage of the dual-stage continuous-time linear equalizer in accordance with an embodiment of the invention.

FIG. 2 is an exemplary circuit diagram of a CTLE peaking amplifier 200 which may be used as the first stage 110 of the dual-stage continuous-time linear equalizer 100 in accordance with an embodiment of the invention. The CTLE peaking amplifier 200 may be utilized advantageously to increase a bandwidth of the equalization by increasing the amplification of higher frequencies.

As shown, the CTLE peaking amplifier 200 may include two transconductance-transimpedance amplifier pairs: a first pair being M1 and M3; and a second pair being M2 and M4.

The drain of M1 is connected to the gate of M3. Similarly, the drain of M2 is connected to the gate of M4. As such, M1 and M3 form the first transconductance-transimpedance amplifier pair, and M2 and M4 form the second transconductance-transimpedance amplifier pair.

The differential voltage input signal Vin may be received between the gates of transistors M1 and M2. The differential output signal Vout may be provided between the gates of transistors M3 and M4.

A shunt peaking inductor Lsp and load resistor Rload may be configured in series between the voltage source Vdd and the drain of each of the four transistors M1, M2, M3 and M4. The inductance of the shunt peaking inductors Lsp may be configured, in addition to the value of other components, to provide a peak in the response at a characteristic frequency fc1 so as to effectively increase the bandwidth of the circuit.

The sources of transistors M1, M2, M3 and M4 are coupled to the drains of transistors M5, M6, M7 and M8, respectively. The sources of M5, M6, M7 and M8 are each connected to ground. Voltage VB may be applied to the gates of transistors M5, M6, M7 and M8 such that they are each in saturation.

In addition, a first shunt resistor Rs may be configured between a first node and a second node, where the first node is between the source of M1 and the drain of M5, and the second node is between the source of M2 and the drain of M6. Similarly, a second shunt resistor Rs may be configured between a third node and a fourth node, where the third node is between the source of M3 and the drain of M7, and the second node is between the source of M4 and the drain of M8.

In order to further increase the bandwidth of the circuit, series feedback may be provided by a resistor Rfb connected between the drain and gate of M3 and between the drain and gate of M4. The series feedback amplifies higher-frequency components but attenuates lower-frequency components. As discussed further below, the second stage 120 of the dual-stage continuous-time linear equalizer 100 may be configured to compensate for the low-frequency attenuation caused by the series feedback.

Figure 3:
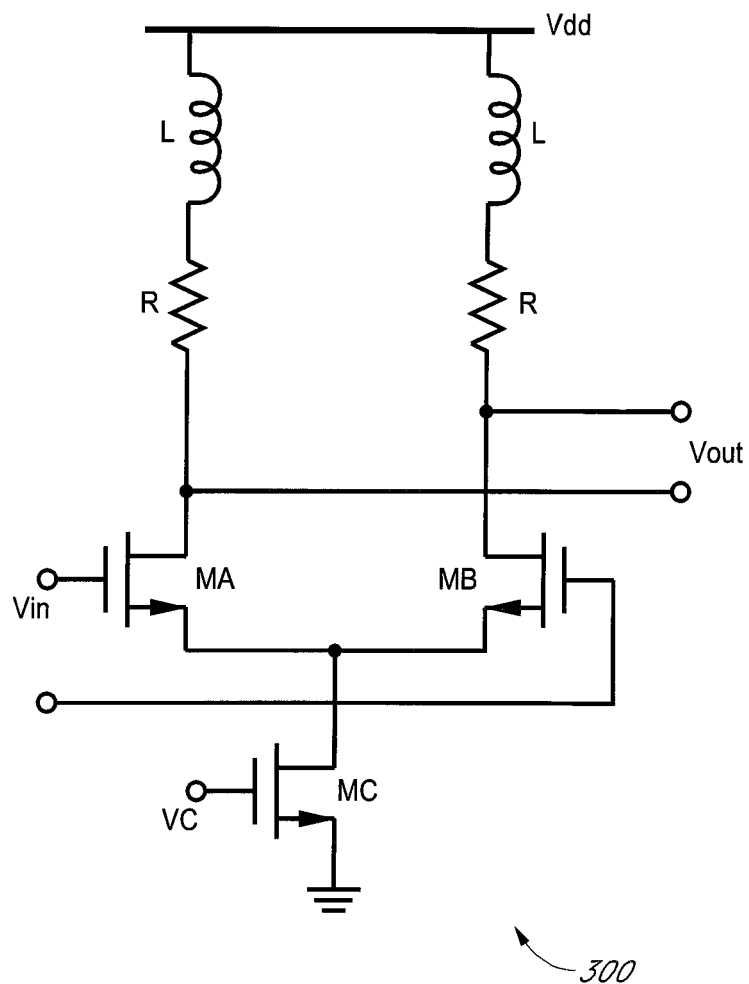
FIG. 3 is an exemplary circuit diagram of a wideband transconductance amplifier which may be used as the second stage of the dual-stage continuous-time linear equalizer in accordance with an embodiment of the invention.

FIG. 3 is an exemplary circuit diagram of a wideband transconductance amplifier 300 which may be used as the second stage 120 of the dual-stage continuous-time linear equalizer 100 in accordance with an embodiment of the invention. The wideband transconductance amplifier 300 may be utilized advantageously to compensate for the lower-frequency attenuation caused by the CTLE peaking amplifier 200.

As shown, the differential voltage input signal Vin may be received between the gates of transistors MA and MB, while the differential voltage output signal Vout may be provided between the drains of transistors MA and MB.

An inductor L and a resistor R may be configured in series between the voltage source Vdd and the drain of each of the two transistors MA and MB. The sources of the two transistors MA and MB are each connected to the drain of the transistor MC, and the source of transistor MC is connected to ground. Voltage VC may be applied to the gates of transistor MC such that it is in saturation.

The common source topology of the amplifier 300 is largely limited by the speed of the transistors. As such, the R/L ratio of the amplifier 300 may be set advantageously to achieve a maximum bandwidth. The frequency response of the amplifier 300 may remain relatively flat below a characteristic frequency fc2.

In accordance with an embodiment of the invention, the characteristic frequency fc1 of the first stage 110 may be set to be approximately the same as the characteristic frequency fc2 of the second stage 120. In one particular implementation, to achieve equalization up to a frequency of 25 GHz, both fc1 and fc2 may be set to be 25 GHz or thereabout. More generally, to achieve equalization up to a frequency of X GHz, fc1 and fc2 may be both set to be X GHz or thereabout.

Figure 4:
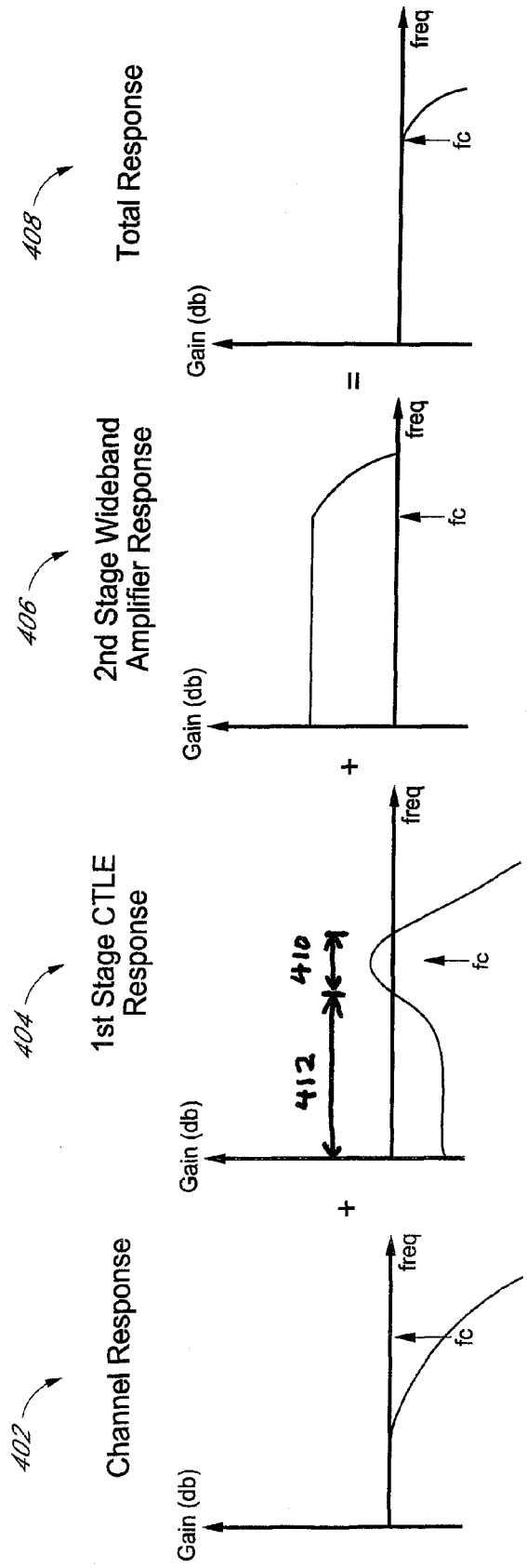
FIG. 4 shows theoretical frequency responses for a lossy channel cascaded with the dual-stage continuous-time linear equalizer in accordance with an embodiment of the invention.

FIG. 4 shows theoretical frequency responses for a lossy channel cascaded with the dual-stage continuous-time linear equalizer in accordance with an embodiment of the invention. Shown in FIG. 4 are the lossy channel response 402, the first stage CTLE response 404, the second stage wideband amplifier response 406, and the total response 408.

In this example, the characteristic frequency fc1 of the first stage 110 and the characteristic frequency fc2 of the second stage 120 are set to be the same (or approximately the same). In other words, the characteristic frequency fc=fc1=fc2. This characteristic frequency fc is shown in each of the frequency responses depicted in FIG. 4.

As seen, the channel response 402 may be near unity at low frequencies but drops off at higher frequencies. At the characteristic frequency fc, the channel response 402 is already substantially attenuated.

The first stage response 404 has a gain peak in a first (higher) frequency range 410 surrounding and peaking at the characteristic frequency fc. However, it attenuates lower frequencies in a second (lower) frequency range 412 below the first frequency range 410. The second stage 406 has a gain at lower frequencies that begins to roll off at the characteristic frequency fc. The gain at lower frequencies at the second stage 406 covers the second frequency range 412 compensates for the attenuation of lower frequencies in the second frequency range 412 at the first stage 404.

The total response 406 combines the channel response 402, the first stage response 404 and the second stage response 406. As seen, the total response 406 has a bandwidth that extends out from DC and begins to roll off at the characteristic frequency fc.

Figure 5:
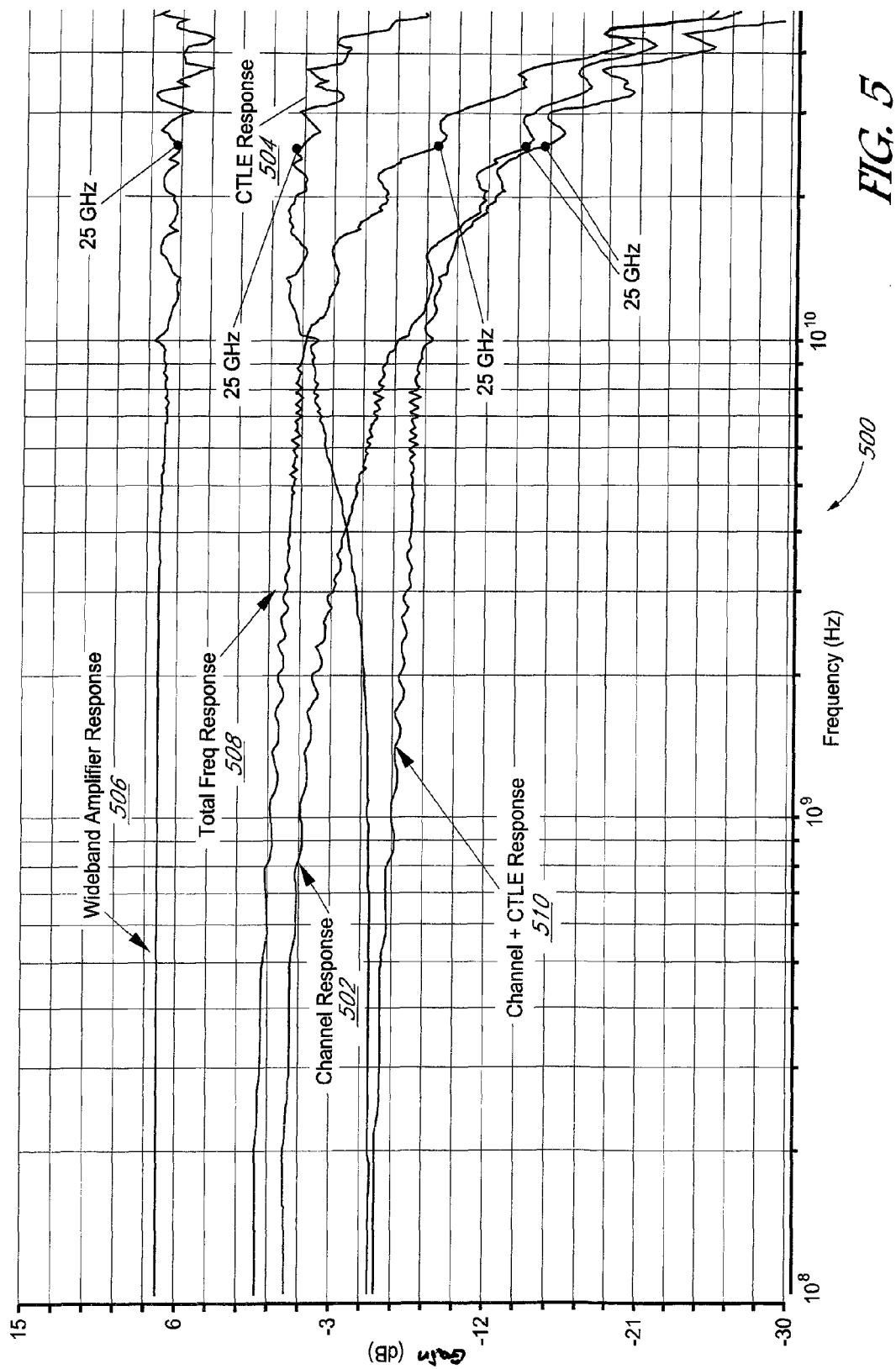
FIG. 5 shows simulated frequency responses for a realistic, lossy channel cascaded with the dual-stage continuous-time linear equalizer in accordance with an embodiment of the invention.

FIG. 5 shows simulated frequency responses for a realistic, lossy channel cascaded with the dual-stage continuous-time linear equalizer in accordance with an embodiment of the invention. Shown in FIG. 5 are the lossy channel response 502, the first stage CTLE response 504, the second stage wideband amplifier response 506, and the total frequency response 508. Also shown is combination 510 of the channel response 502 and the CTLE response 504 (without the wideband amplifier response 506).

In this example, the characteristic frequencies of the first stage 110 and the second stage 120 are set to be approximately 25 GHz. This characteristic frequency is shown on various of the frequency responses depicted in FIG. 5.

As seen, the channel response 502 may be near unity at low frequencies but drops off at higher frequencies. At 25 GHz, the channel response 502 is already substantially attenuated.

The first stage response 504 has a gain peak at about 25 GHz. However, it attenuates lower frequencies. The second stage 506 has a gain at lower frequencies that begins to roll off at roughly about 25 GHz. The gain at lower frequencies at the second stage 506 compensates for the attenuation at lower frequencies at the first stage 504.

The total response 506 combines the channel response 502, the first stage response 504 and the second stage response 506. As seen, the total response 506 has a bandwidth that extends out from DC to about 10 GHz and begins to roll off after that point. The roll-off is somewhat moderate in that the attenuation is about −9 dB at 25 GHz. This attenuation at 25 GHz may be reduced, for example, by cascading another dual stage to increase the gain at 25 GHz.

Figure 6:
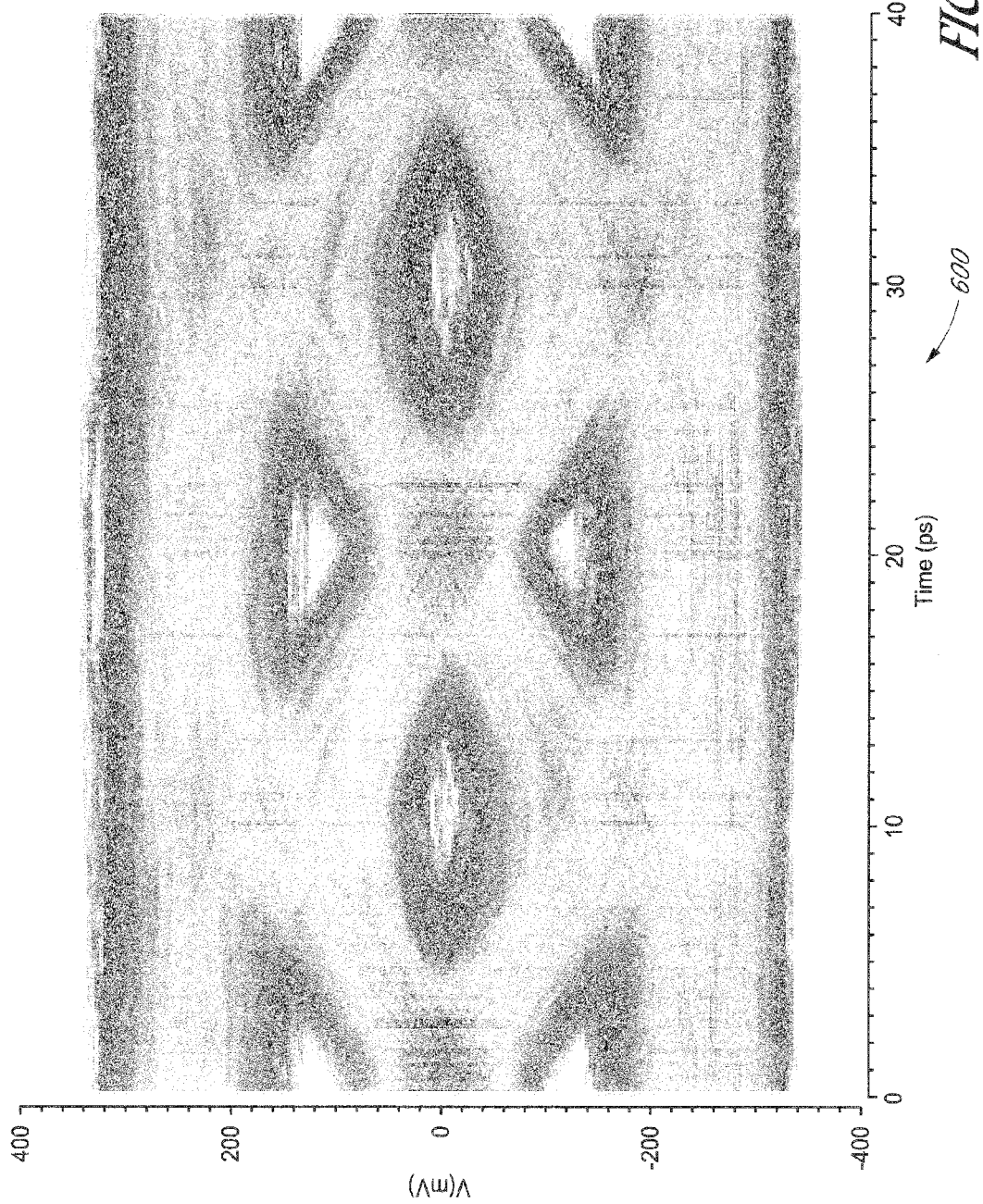
FIG. 6 shows an eye diagram at an input of the dual-stage continuous-time linear equalizer in accordance with an embodiment of the invention.

FIG. 6 shows an eye diagram 600 at an input of the dual-stage continuous-time linear equalizer in accordance with an embodiment of the invention. In contrast, FIG. 7 shows an eye diagram 700 after equalization by the dual-stage continuous-time linear equalizer in accordance with an embodiment of the invention.

Figure 7:
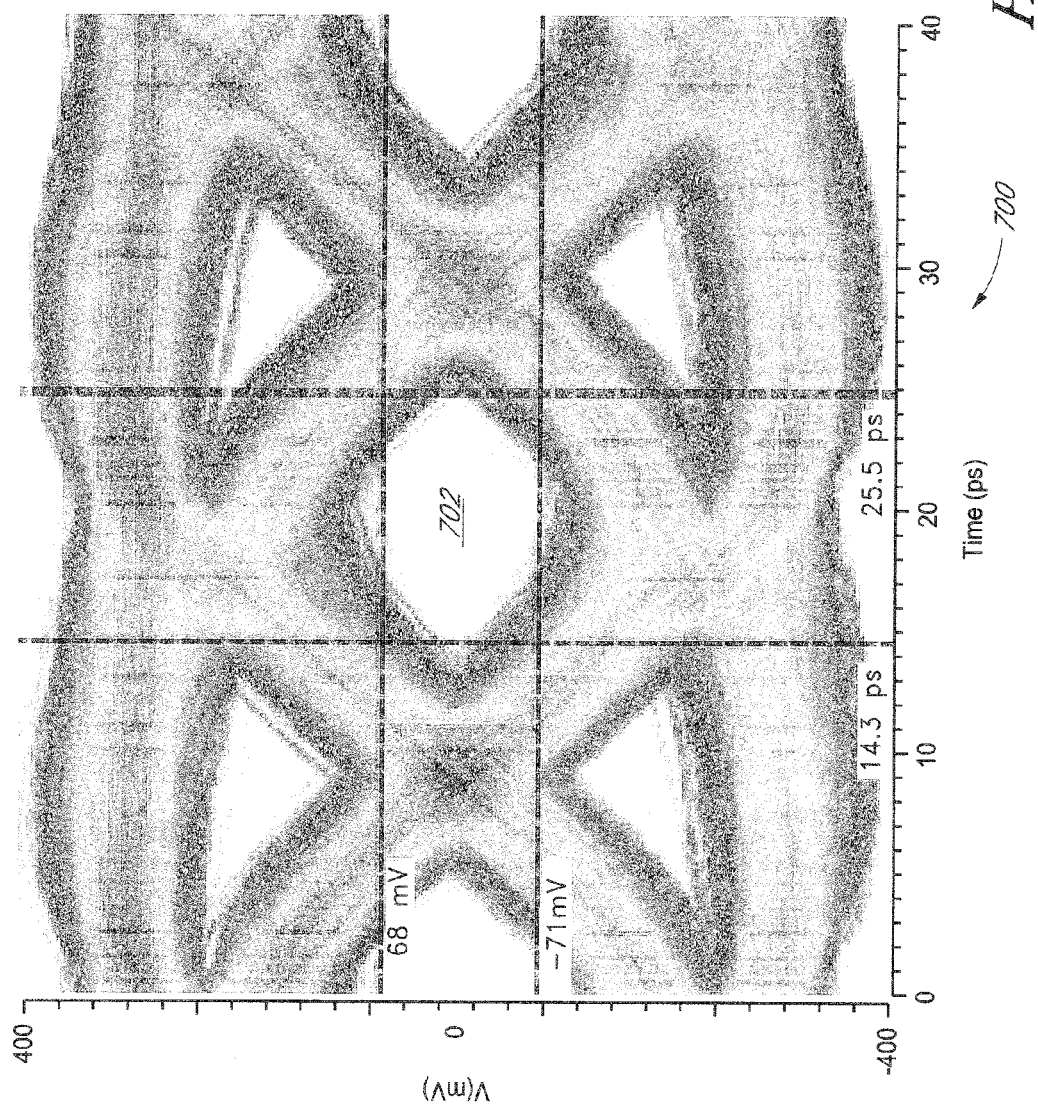
FIG. 7 shows an eye diagram after equalization by the dual-stage continuous-time linear equalizer in accordance with an embodiment of the invention.

As seen, the eye opening 702 is substantially larger in the eye diagram 700 of FIG. 7. The eye opening 702 after equalization is shown to extend from approximately 68 mV (milli volts) to −71 mV and from 14.3 ps (picoseconds) to 25.5 ps.

Figure 8:
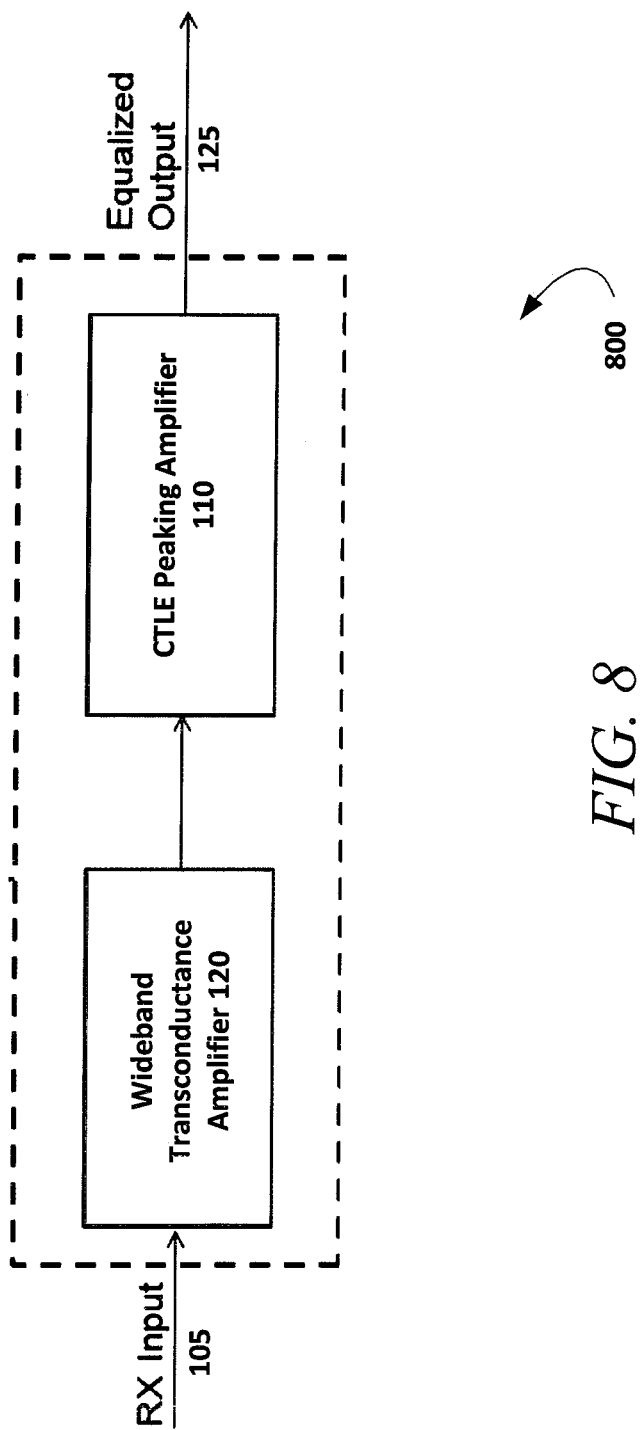
FIG. 8 is a high-level diagram of a dual-stage continuous-time linear equalizer in accordance with an alternate embodiment of the invention.

FIG. 8 is a high-level diagram of a dual-stage continuous-time linear equalizer 800 in accordance with an alternate embodiment of the invention. In this embodiment, the wideband transconductance amplifier 120 is the first equalization stage, and the CTLE peaking amplifier 110 is the second equalization stage.

Figure 9:
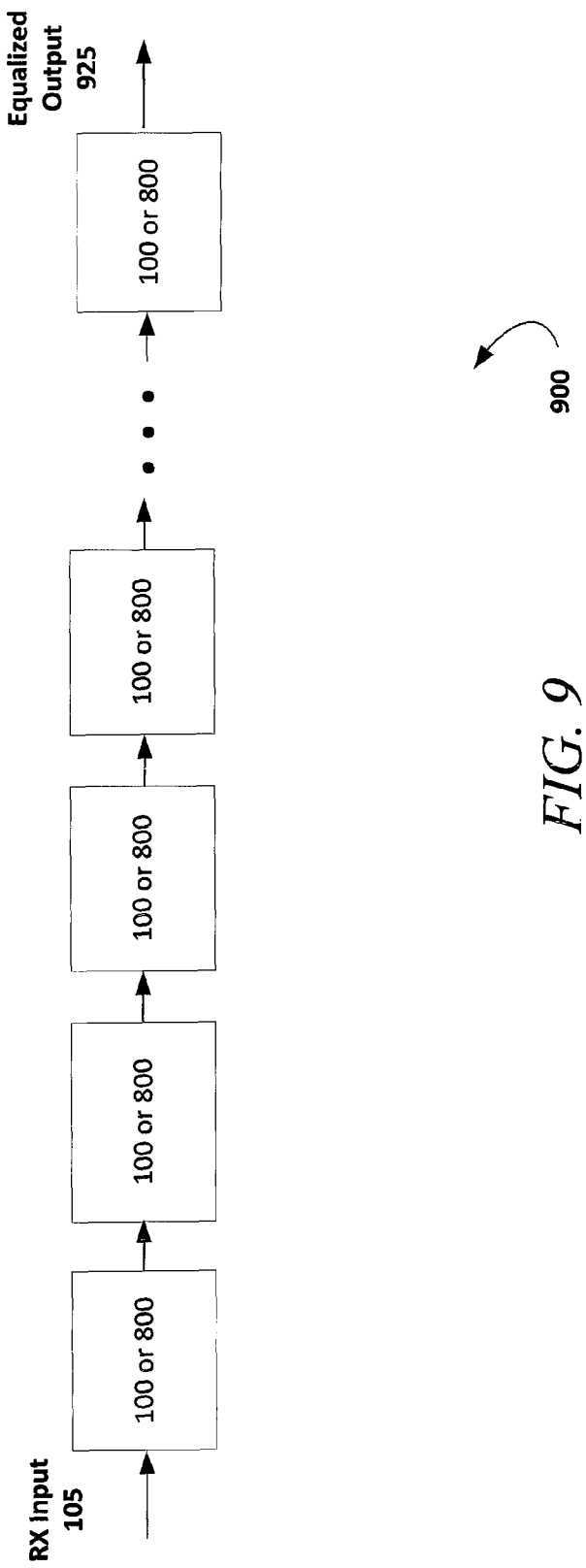
FIG. 9 is a high-level diagram of an equalizer with a cascade of multiple dual stages in accordance with an embodiment of the invention.

FIG. 9 is a high-level diagram of an equalizer 900 with a cascade of multiple dual stages in accordance with an embodiment of the invention. As shown, each dual stage may be configured either as the dual stage 100 of FIG. 1 or the dual stage 800 of FIG. 8. Any number of dual stages may be used, depending on the gain required. In one embodiment, two dual stages (100 or 800) may be applied between the RX input 125 and the equalized output 925. In another embodiment, three dual stages (100 or 800) may be applied between the RX input 125 and the equalized output 925. More generally, N dual stages (100 or 800) may be applied between the RX input 125 and the equalized output 925, where N is one or more.

Figure 10:
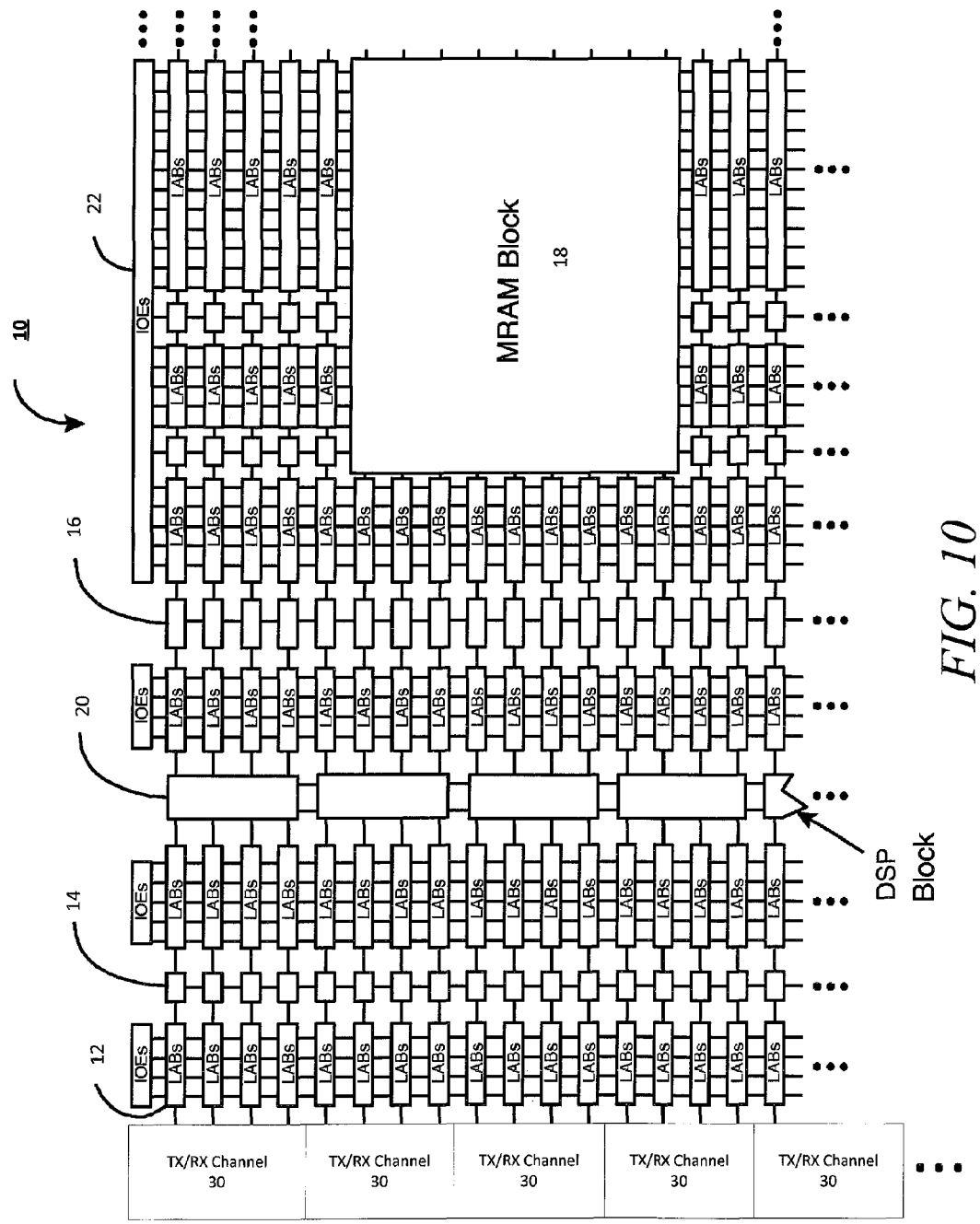
FIG. 10 is a simplified partial block diagram of an exemplary field programmable gate array (FPGA) that may be configured to implement an embodiment of the present invention.

FIG. 10 is a simplified partial block diagram of an exemplary field programmable gate array (FPGA) 10 that may be configured to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10.

A transceiver (TX/RX) channel array may be arranged as shown, for example, with each TX/RX channel circuit 30 being coupled to several LABs. Each TX/RX channel circuit 30 may include, among other circuitry, a RX channel circuit with an equalizer such as disclosed herein.

It is to be understood that FPGA 10 is described herein for illustrative purposes only and that the present invention can be implemented in many different types of PLDs, FPGAs, and ASICs.

Figure 11:
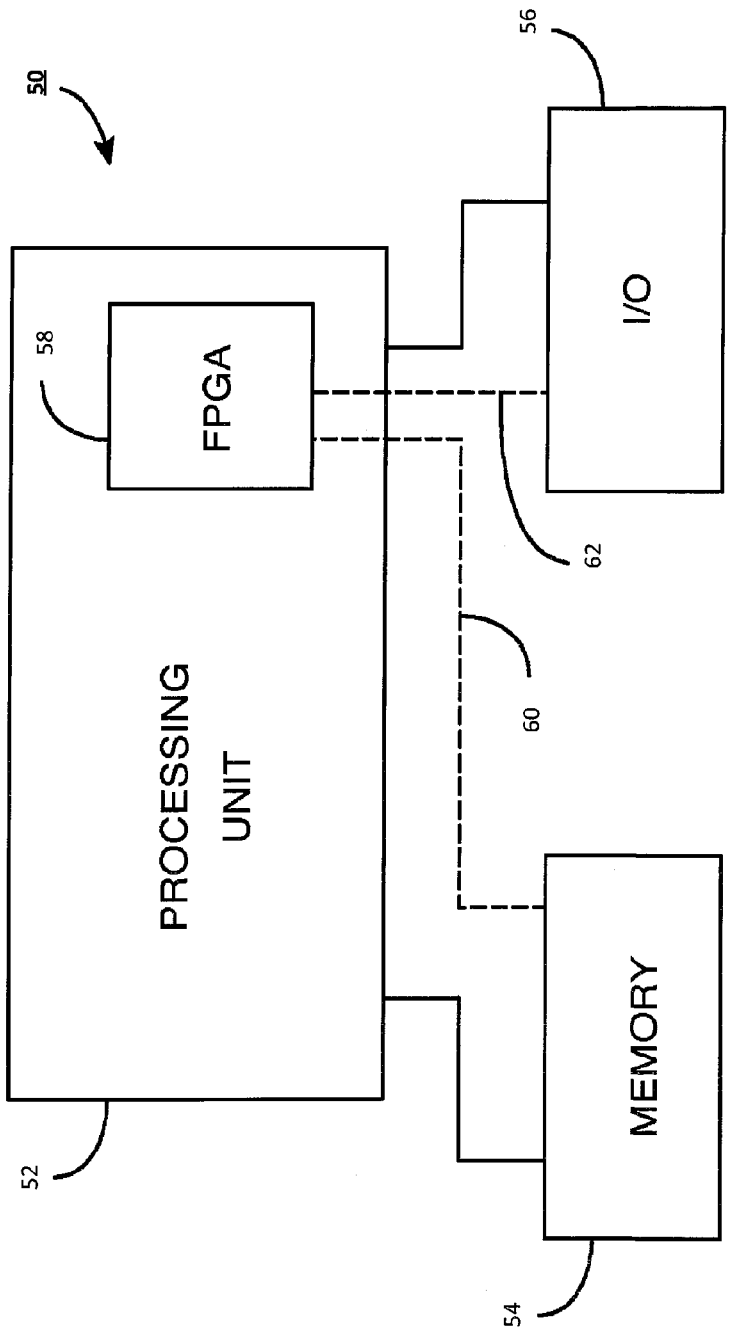
FIG. 11 shows a block diagram of an exemplary digital system that may employ PDN noise reduction techniques as disclosed herein.

FIG. 11 shows a block diagram of an exemplary digital system 50 that may employ techniques disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An equalizer comprising:
   a first amplifier stage configured to receive an input signal and apply a first gain at a characteristic frequency while attenuating frequencies in a low frequency range below the characteristic frequency to generate an output of the first amplifier stage, wherein the first amplifier stage comprises a continuous-time linear equalization (CTLE) peaking amplifier, and wherein the first gain comprises a peak in gain as a function of frequency, where the peak in gain is at the characteristic frequency; and a second amplifier stage configured to receive the output from the first amplifier stage and apply a second gain at the frequencies in the low frequency range to generate an output of the second amplifier stage, wherein the second amplifier stage comprises a wideband transconductance amplifier.

2. The equalizer of claim 1, wherein the CTLE peaking amplifier comprises:
a first amplifier pair comprising a first transconductance amplifier and a first transimpedance amplifier; and
a second amplifier pair comprising a second transconductance amplifier and a second transimpedance amplifier.

3. The equalizer of claim 2,
wherein the first transconductance amplifier comprises a first transistor which includes a gate, a drain and a source, and the first transimpedance amplifier comprises a third transistor which includes a gate, a drain and a source, wherein the drain of the first transistor is connected to the gate of the third transistor,
wherein the second transconductance amplifier comprises a second transistor which includes a gate, a drain and a source, and the second transimpedance amplifier comprises a fourth transistor which includes a gate, a drain and a source, wherein the drain of the second transistor is connected to the gate of the fourth transistor, and
wherein an input differential voltage signal is received between the gates of the first and the second transistors, and wherein an output differential voltage signal is generated between the drains of the third and the fourth transistors.

4. The equalizer of claim 3, wherein the CTLE peaking amplifier further comprises:
a first inductor and a first load resistor in series between a voltage source and the drain of the first transistor;
a second inductor and a second load resistor in series between the voltage source and the drain of the second transistor;
a third inductor and a third load resistor in series between the voltage source and the drain of the second transistor; and
a fourth inductor and a fourth load resistor in series between the voltage source and the drain of the fourth transistor.

5. The equalizer of claim 4, wherein the CTLE peaking amplifier further comprises:
a first feedback resistor connected between the drain and the gate of the third transistor; and
a second feedback resistor connected between the drain and the gate of the fourth transistor.

6. The equalizer of claim 5, wherein the CTLE peaking amplifier further comprises:
a fifth transistor coupled between a source of the first transistor and ground;
a sixth transistor coupled between a source of the second transistor and ground;
a seventh transistor coupled between a source of the third transistor and ground;
an eighth transistor coupled between a source of the fourth transistor and ground;
a first shunt resistor connected between the source of the first transistor and the source of the second transistor; and
a second shunt resistor connected between the source of the third transistor and the source of the fourth transistor.

7. The equalizer of claim 1, wherein the wideband transconductance amplifier comprises:
a first transistor comprising a gate, a drain and a source; and
a second transistor comprising a gate, a drain and a source,
wherein an input differential voltage signal is received between the gates of the first and second transistors, and
wherein an output differential voltage signal is generated between the drains of the first and second transistors.

8. The equalizer of claim 7, wherein the wideband transconductance amplifier further comprises:
a third transistor comprising a gate, a drain and a source, wherein the drain of the third transistor is connected to the sources of the first and second transistors.

9. The equalizer of claim 1, further comprising:
a third amplifier stage configured to receive the output of the second amplifier stage and apply a third gain at the characteristic frequency while attenuating the frequencies in the low frequency range to generate an output of the third amplifier stage; and
a fourth amplifier stage configured to receive the output of the third amplifier stage and apply a fourth gain at the frequencies in the low frequency range to generate an output of the fourth amplifier stage.

10. The equalizer of claim 1, wherein the characteristic frequency is at least twenty-five gigahertz.

11. A method of linear equalization, the method comprising:
receiving an analog signal,
applying a first gain to the analog signal at a characteristic frequency while attenuating the analog signals at frequencies in a low frequency range below the characteristic frequency, wherein the first gain is provided by a continuous-time linear equalization (CTLE) peaking amplifier; and
applying a second gain to the analog signal at the frequencies in the low frequency range, wherein the second gain is provided by a wideband transconductance amplifier.

12. The method of claim 11, wherein the CTLE peaking amplifier includes a first amplifier pair comprising a first transconductance amplifier and a first transimpedance amplifier and a second amplifier pair comprising a second transconductance amplifier and a second transimpedance amplifier.

13. The method of claim 12, wherein the CTLE peaking amplifier further includes a first inductor and a first load resistor in series between a voltage source and the first transconductance amplifier, a second inductor and a second load resistor in series between the voltage source and the second transconductance amplifier, a third inductor and a third load resistor in series between the voltage source and the first transimpedance amplifier, and a fourth inductor and a fourth load resistor in series between the voltage source and the second transimpedance amplifier.

14. The method of claim 13, wherein the CTLE peaking amplifier further includes a first feedback resistor connected between the first and the third load resistors, and a second feedback resistor connected between the second and the fourth load resistors.

15. The method of claim 11, wherein the wideband transconductance amplifier comprises:
a first transistor comprising a gate, a drain and a source; and
a second transistor comprising a gate, a drain and a source, wherein the intermediate analog signal is received between the gates of the first and second transistors, and wherein the output analog signal is generated between the drains of the first and second transistors.

16. The method of claim 11 further comprising:

after applying the second gain, applying a third gain to the analog signal at the characteristic frequency while attenuating the analog at the frequencies in the low frequency range; and after applying the third gain, applying a fourth gain to the analog signal at the low frequencies.

17. The method of claim 11, wherein the characteristic frequency is at least twenty-five gigahertz.

* * * * *